United States Patent
Cok

(10) Patent No.: US 9,930,277 B2
(45) Date of Patent: Mar. 27, 2018

(54) SERIAL ROW-SELECT MATRIX-ADDRESSED SYSTEM

(71) Applicant: X-Celeprint Limited, Cork (IE)

(72) Inventor: Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/003,721

(22) Filed: Jan. 21, 2016

(65) Prior Publication Data

US 2017/0187976 A1    Jun. 29, 2017

Related U.S. Application Data

(60) Provisional application No. 62/387,259, filed on Dec. 23, 2015.

(51) Int. Cl.
| | | |
|---|---|---|
| H04N 5/376 | (2011.01) | |
| G09G 3/36 | (2006.01) | |
| G09G 3/3208 | (2016.01) | |

(52) U.S. Cl.
CPC .......... *H04N 5/376* (2013.01); *G09G 3/3208* (2013.01); *G09G 3/3611* (2013.01); *G09G 2310/0221* (2013.01); *G09G 2310/0286* (2013.01)

(58) Field of Classification Search
CPC .... H04N 5/376; G09G 3/3611; G09G 3/3208; G09G 2310/0221; G09G 2310/0286
See application file for complete search history.

(56) References Cited

U.S. PATENT DOCUMENTS

| | | |
|---|---|---|
| 5,550,066 A | 8/1996 | Tang et al. |
| 5,621,555 A | 4/1997 | Park |
| 5,731,802 A | 3/1998 | Aras et al. |
| 5,815,303 A | 9/1998 | Berlin |

(Continued)

FOREIGN PATENT DOCUMENTS

| | | | |
|---|---|---|---|
| GB | 2 496 183 A | 5/2013 | |
| WO | WO-2006/027730 A1 | 3/2006 | |

(Continued)

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).

(Continued)

*Primary Examiner* — Hung H Lam
(74) *Attorney, Agent, or Firm* — William R. Haulbrook; Alexander D. Augst; Choate, Hall & Stewart LLP

(57) ABSTRACT

A matrix-addressed system includes a system substrate and an array of pixels arranged in rows and columns disposed on the system substrate. A column-control circuit provides information to or receives information from the pixels. The column-control circuit includes a separate column-driver circuit connected to each column of pixels that provides information in common to all of the pixels in the column or receives information in common from all of the pixels in the column. A row-select circuit likewise disposed on the system substrate includes a serial shift register having a number of row storage elements equal to or larger than the number of rows in the array of pixels. Each row storage element in the shift register has a row-select line connected to all of the pixels in a row.

21 Claims, 14 Drawing Sheets

(56) References Cited

U.S. PATENT DOCUMENTS

| | | |
|---|---|---|
| 5,912,712 A | 6/1999 | Doherty |
| 5,994,722 A | 11/1999 | Averbeck et al. |
| 6,084,579 A | 7/2000 | Hirano |
| 6,184,477 B1 | 2/2001 | Tanahashi |
| 6,278,242 B1 | 8/2001 | Cok et al. |
| 6,392,340 B2 | 5/2002 | Yoneda et al. |
| 6,448,718 B1 | 9/2002 | Battersby |
| 6,466,281 B1 | 10/2002 | Huang et al. |
| 6,577,367 B2 | 6/2003 | Kim |
| 6,660,457 B1 | 12/2003 | Imai et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,933,532 B2 | 8/2005 | Arnold et al. |
| 7,012,382 B2 | 3/2006 | Cheang et al. |
| 7,091,523 B2 | 8/2006 | Cok et al. |
| 7,129,457 B2 | 10/2006 | McElroy et al. |
| 7,195,733 B2 | 3/2007 | Rogers et al. |
| 7,288,753 B2 | 10/2007 | Cok |
| 7,402,951 B2 | 7/2008 | Cok |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,738,001 B2 | 6/2010 | Routley et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,207,635 B2 | 6/2012 | Covaro |
| 8,243,027 B2 | 8/2012 | Hotelling et al. |
| 8,261,660 B2 | 9/2012 | Menard |
| 8,334,545 B2 | 12/2012 | Levermore et al. |
| 8,394,706 B2 | 3/2013 | Nuzzo et al. |
| 8,421,791 B2 | 4/2013 | Harada |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 9,153,171 B2 | 10/2015 | Sakariya et al. |
| 9,202,996 B2 | 12/2015 | Orsley et al. |
| 9,520,537 B2 | 12/2016 | Bower et al. |
| 9,626,908 B2 | 4/2017 | Sakariya et al. |
| 9,640,108 B2 | 5/2017 | Cok et al. |
| 2001/0022564 A1 | 9/2001 | Youngquist et al. |
| 2002/0096994 A1 | 7/2002 | Iwafuchi et al. |
| 2003/0189829 A1 | 10/2003 | Shimizu et al. |
| 2003/0223275 A1 | 12/2003 | Abe |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0275615 A1 | 12/2005 | Kahen et al. |
| 2006/0063309 A1 | 3/2006 | Sugiyama et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2008/0180381 A1 | 7/2008 | Jeong et al. |
| 2008/0259019 A1 | 10/2008 | Ng |
| 2009/0147033 A1 | 6/2009 | Arai et al. |
| 2009/0273303 A1 | 11/2009 | Peng |
| 2009/0315054 A1 | 12/2009 | Kim et al. |
| 2010/0045690 A1 | 2/2010 | Handschy et al. |
| 2010/0078670 A1 | 4/2010 | Kim et al. |
| 2010/0085295 A1 | 4/2010 | Zhao et al. |
| 2010/0123268 A1 | 5/2010 | Menard |
| 2010/0214247 A1 | 8/2010 | Tang et al. |
| 2010/0248484 A1 | 9/2010 | Bower et al. |
| 2010/0258710 A1 | 10/2010 | Wiese et al. |
| 2010/0317132 A1 | 12/2010 | Rogers et al. |
| 2011/0084993 A1 | 4/2011 | Kawabe |
| 2011/0199011 A1 | 8/2011 | Nakazawa |
| 2011/0211348 A1 | 9/2011 | Kim |
| 2012/0126229 A1 | 5/2012 | Bower |
| 2012/0228669 A1 | 9/2012 | Bower et al. |
| 2012/0314388 A1 | 12/2012 | Bower et al. |
| 2013/0015483 A1 | 1/2013 | Shimokawa et al. |
| 2013/0069275 A1 | 3/2013 | Menard et al. |
| 2013/0088416 A1 | 4/2013 | Smith et al. |
| 2013/0141469 A1 | 6/2013 | Xu |
| 2013/0153277 A1 | 6/2013 | Menard et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0055654 A1* | 2/2014 | Borthakur ............ H04N 5/335 348/302 |
| 2014/0104243 A1 | 4/2014 | Sakariya et al. |
| 2014/0184667 A1 | 7/2014 | Xu |
| 2014/0217448 A1 | 8/2014 | Kim et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0181148 A1* | 6/2015 | Slovick ................ H04N 5/378 348/231.99 |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0302795 A1 | 10/2015 | Genoe |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0093600 A1 | 3/2016 | Bower et al. |
| 2016/0119565 A1* | 4/2016 | Fujita ................ H04N 5/37457 348/301 |

(56) References Cited

U.S. PATENT DOCUMENTS

| | | |
|---|---|---|
| 2016/0127668 A1* | 5/2016 | Fujita ............... H04N 5/369 348/308 |
| 2016/0163253 A1 | 6/2016 | Chaji et al. |
| 2016/0212361 A1* | 7/2016 | Suzuki ............... H04N 5/374 |
| 2016/0343771 A1 | 11/2016 | Bower et al. |
| 2017/0040371 A1* | 2/2017 | Izuhara ............ H01L 27/14634 |
| 2017/0047393 A1 | 2/2017 | Bower et al. |
| 2017/0061867 A1 | 3/2017 | Cok et al. |
| 2017/0154819 A1 | 6/2017 | Bower et al. |
| 2017/0186356 A1 | 6/2017 | Cok |
| 2017/0188427 A1 | 6/2017 | Cok et al. |
| 2017/0206820 A1 | 7/2017 | Cok et al. |
| 2017/0206845 A1 | 7/2017 | Sakariya et al. |
| 2017/0330509 A1 | 11/2017 | Cok et al. |

FOREIGN PATENT DOCUMENTS

| | | |
|---|---|---|
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640 × 480 Pixel Computer Display Using Pin Diodes with Device Redundancy, 1988 International Display Research Conference, IEEE, CH-2678-1/88:152-154 (1988).

Cok, R. S. et al., AMOLED displays with transfer-printed integrated circuits, Journal of SID 19/(4):335-341(2011).

Hamer et al., 63.2: AMOLED Displays Using Transfer-Printed Integrated Circuits, SID 09 DIGEST, 40(2):947-950 (2009).

* cited by examiner

SERIAL ROW-SELECT MATRIX-ADDRESSED SYSTEM

RELATED APPLICATIONS

This application claims priority to and the benefit of U.S. Provisional Patent Application No. 62/387,259, filed Dec. 23, 2015, titled Serial Row-Select Matrix-Addressed System, the contents of which are incorporated by reference herein in its entirety.

This application is related to commonly assigned U.S. patent application Ser. No. 14/835,282 filed Aug. 25, 2015, entitled Bit-Plane Pulse Width Modulated Digital Display System, by Cok et al. and to commonly assigned U.S. patent application Ser. No. 14/807,226 filed Jul. 23, 2015, entitled Parallel Redundant Chiplet System, by Cok et al. which are hereby incorporated by reference in their entirety.

FIELD OF THE INVENTION

The present invention relates to matrix-addressed systems such as flat-panel displays or area sensors. In particular, the present invention relates to control methods, devices, and circuits for matrix-addressing a pixel array.

BACKGROUND OF THE INVENTION

Flat-panel displays are widely used in conjunction with computing devices, in portable devices, and for entertainment devices such as televisions. Such displays typically employ an array of pixels distributed in rows and columns over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current. Displays using inorganic light emitting diodes (LEDs) are also in widespread use for outdoor signage and have been demonstrated in a 55-inch television. Flat-panel electronic sensors having a plurality of pixel sensors are also available; for example, for digital radiography.

Flat-panel displays and other matrix-addressed systems such as imaging systems are typically controlled with either a passive-matrix (PM) control employing electronic circuitry external to the display substrate or an active-matrix (AM) control employing electronic circuitry formed directly on the display substrate and associated with each light-emitting element. Both OLED displays and LCDs using passive-matrix control and active-matrix control are available. An example of such an AM OLED display device is disclosed in U.S. Pat. No. 5,550,066.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon or polycrystalline silicon and is distributed over the entire flat-panel display substrate. The semiconductor layer is photolithographically processed to form electronic control elements, such as transistors and capacitors. Additional layers, for example, insulating dielectric layers and conductive metal layers are provided, often by evaporation or sputtering, and photolithographically patterned to form electrical interconnections, or wires. For example, U.S. Pat. No. 8,421,791 discloses a matrix-addressed liquid crystal display and U.S. Pat. No. 6,448,718 discloses an active-matrix-addressed electro-luminescent display.

Typically, each display sub-pixel is controlled by one control element, and each control element includes at least one transistor. For example, in a simple active-matrix organic light-emitting diode (OLED) display, each control element includes two transistors (a select transistor and a power transistor) and one capacitor for storing a charge specifying the luminance of the sub-pixel. Each OLED element employs an independent control electrode connected to the power transistor and a common electrode. In contrast, an LCD typically uses a single transistor to control each pixel. Control of the light-emitting elements is usually provided through a data signal line, a select signal line, a power connection and a ground connection. Active-matrix elements are not necessarily limited to displays and can be distributed over a substrate and employed in other applications requiring spatially distributed control.

Inorganic light-emitting diode displays using inorganic micro-LEDs on a display substrate are also known. Micro-LEDs can have an area less than 1 mm square, less than 100 microns square, or less than 50 microns square or have an area small enough that it is not visible to an unaided observer of the display at a designed viewing distance. U.S. Pat. No. 8,722,458 entitled Optical Systems Fabricated by Printing-Based Assembly teaches transferring light-emitting, light-sensing, or light-collecting semiconductor elements from a wafer substrate to a destination substrate.

Active-matrix display control is typically provided by a display controller that in turn controls a column controller and a row controller. The column controller includes a column drive circuit for each column of pixels. Each column drive circuit is electrically connected to each pixel circuit in the column corresponding to the column drive circuit. Similarly, the row controller includes a circuit for selecting each row of pixels. Each row-selection circuit is electrically connected to each pixel circuit in the row corresponding to the row-selection circuit. In operation, the column controller supplies a data value to each column and the row controller energizes the row-selection circuit corresponding to the row of pixels for which the data values are intended. This arrangement, however, requires a separate electrical connection for each column and for each row. Thus, for an M×N pixel array, M+N electrical connections must be made to the array of pixels and generally to the substrate on which the flat-panel display is provided. For large displays, for example, having thousands of rows and columns of pixels, the cost of connecting the pixel rows and columns can be significant.

There is a need therefore for matrix-addressed system architectures that reduce the number and cost of electrical connections in a matrix-addressed system such as a flat-panel display or imaging system.

SUMMARY OF THE INVENTION

The present invention includes a matrix-addressed system having a system substrate and an array of pixels arranged in rows and columns disposed on the system substrate. A column-control circuit provides information to or receives information from the pixels. The column-control circuit includes a separate column-driver circuit connected to each column of pixels that provides information in common to all of the pixels in the column or receives information in common from all of the pixels in the column. A row-select circuit disposed on the system substrate includes a serial shift register having a number of row storage elements equal to or larger than the number of rows in the array of pixels. Each row storage element in the shift register has a row-select line connected to all of the pixels in a row.

Prior-art matrix addressed systems include row controllers that are not disposed on the substrate and therefore require a large number of interconnections to the substrate (at least as large as the number of rows and columns in the matrix-addressed system). By employing the row-select circuit of the present invention, the number of interconnections to the substrate can be reduced to the number of columns plus one. Furthermore, prior-art row-controller designs require large, relatively complex integrated circuits that can require significant power. In contrast, the present invention can employ an array of very small (a few microns) chiplets or bare integrated circuit dies that reduce the area and power needed to provide row control in the matrix-addressed system. Thus, while prior-art row-controller designs are generally too large to be included on a display or sensor substrate because the perimeter of the display or sensor substrate would be unacceptably large, embodiments of the present invention use microscopic chiplets that have little impact on the perimeter of the display or sensor and therefore, provide a higher level of integration and fewer interconnections.

Embodiments of the present invention provide matrix-addressed arrays of transducers, for example light emitters, heat emitters, piezo devices, field generators, light sensors, touch sensors, capacitive sensors, mechanical sensors, or any other device that outputs energy or senses energy or environmental attributes.

Embodiments of the present invention provide passive-matrix or active-matrix control of the matrix-addressed array or pixels. Pixels included in the present invention include one-or-more pixel storage devices, such as capacitors or flip flops. In an embodiment, the pixel storage devices store red, green, and blue information in a full-color pixel.

Pixels of the present invention can include pixel circuits that are formed in pixel substrates, for example, bare die or unpackaged integrated circuit substrate that are separate and distinct from the system substrate. The present invention can also include light elements formed in or on light element substrates, for example bare die or unpackaged integrated circuit substrate that are separate and distinct from the system substrate. The row-select circuit can also be formed in or on one or more row-select substrates, for example, bare die or unpackaged integrated circuit substrate that are separate and distinct from the system substrate. The separate and distinct substrates can be micro-transfer printed onto the system substrate. Alternatively, in an embodiment, the pixel substrates and the light element substrates are micro-transfer printed onto a pixel module substrates that are separate and distinct from the system substrate, the light element substrates, the pixel substrates, and the row-select substrates. The pixel module substrates can be disposed on the system substrate, for example by pick-and-place methods or micro-transfer methods. By employing micro-transfer printing methods, larger substrates with higher performance are provided in an efficient manufacturing process.

In another embodiment, redundant circuit elements, for example, redundant row storage elements, are provided to increase the robustness of the matrix-addressed system.

In an embodiment, the light elements are micro-light-emitting diodes (micro-LEDs) or photo-sensors that each has a width from 2 to 5 µm, 5 to 10 µm, 10 to 20 µm, or 20 to 50 µm, each has a length from 2 to 5 µm, 5 to 10 µm, 10 to 20 µm, or 20 to 50 µm, or each has a height from 2 to 5 µm, 4 to 10 µm, 10 to 20 µm, or 20 to 50 µm. The pixel substrates or the row-select substrates can each have a length from 2 to 5 µm, 5 to 10 µm, 10 to 20 µm, or 20 to 50 µm, or can each have a height from 2 to 5 µm, 4 to 10 µm, 10 to 20 µm, or 20 to 50 µm.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
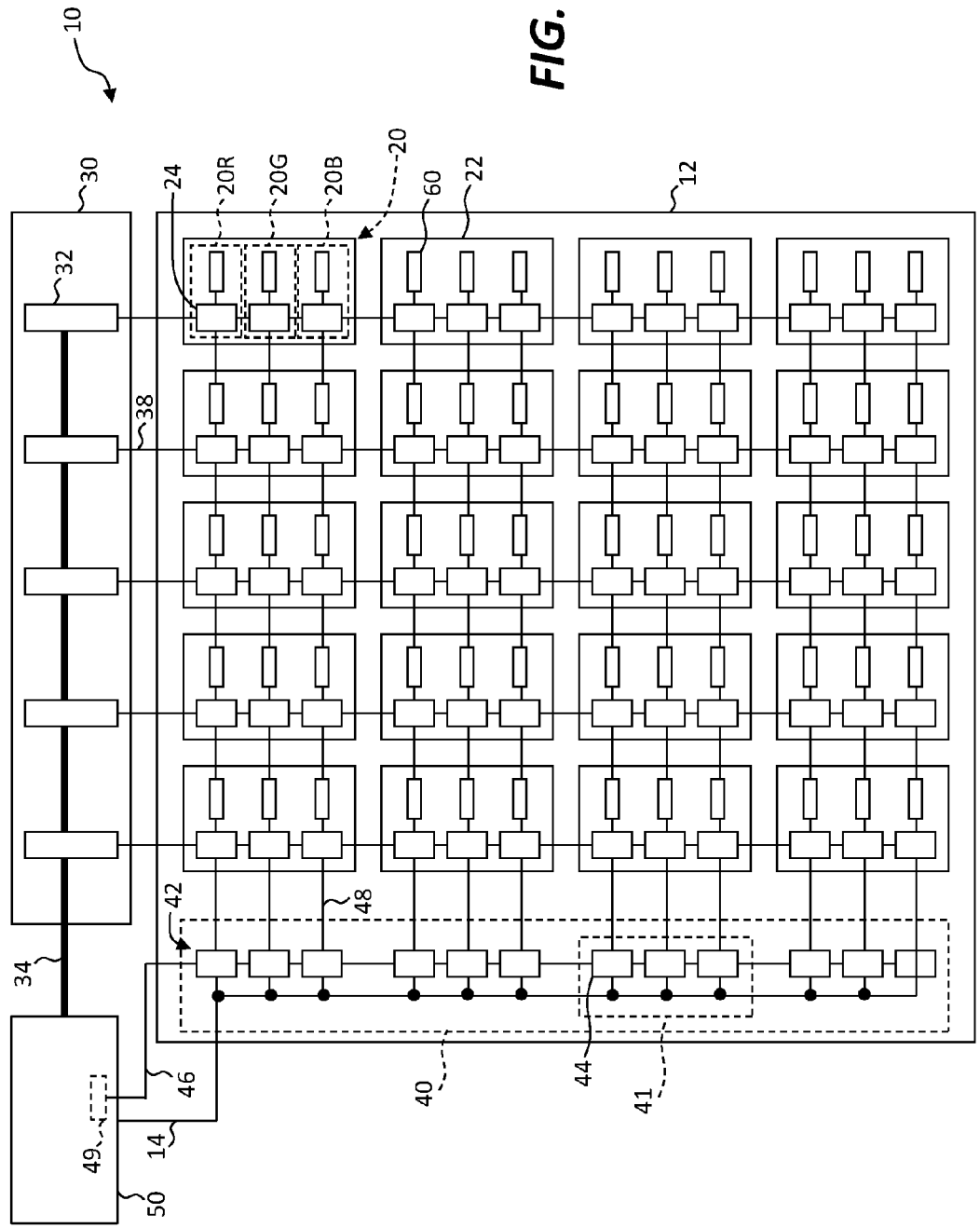
FIG. 1 is a schematic diagram of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to the schematic diagram of FIG. 1, a matrix-addressed system 10 of the present invention includes a system substrate 12. An array of pixels 20 are arranged in rows and columns and disposed on the system substrate 12. Each pixel 20 includes one or more light elements 60 such as light emitters or light sensors. A column-control circuit 30 provides information to the pixels 20, for example through column lines 38. The column-control circuit 30 includes a separate column-driver circuit 32 connected to each column of pixels 20; for example, through the column lines 38 that provides information in common to all of the pixels 20 in the corresponding column. A row-select circuit 40 is disposed on the system substrate 12. The row-select circuit 40 includes a serial shift register 42 having a number of row storage elements 44 equal to or larger than the number of rows in the array of pixels 20. Each row storage element 44 in the serial shift register 42 has a row-select line 48 connected to all of the pixels 20 in a row. The column-control circuit 30, the row-select circuit 40, and the array of pixels 20 can be responsive to a system controller 50 that provides data and control signals to them. In one embodiment, the matrix-addressed system is a display system including an array of light emitters. In another embodiment, the matrix-addressed system is a sensor system including an array of sensors. In embodiments of the present invention, rows and columns can be interchanged.

The system substrate 12 can be, for example, a display substrate or sensor substrate incorporating glass, metal, polymer, resin, cured resin, or ceramic. The pixels 20 can be light-emitting pixels, for example including micro-light-emitting diodes (micro-LEDs) or sensors responsive to electromagnetic radiation such as visible light, infrared radiation, ultraviolet radiation, or x-rays.

The column-control circuit 30 can be a digital circuit including a serial shift register of flip-flops or digital latches or an analog shift register including capacitors for shifting rows of pixel information into alignment with the pixel columns in the array. The column-control circuit 30 can be an integrated circuit or include other discrete electronic components and includes an array of column-driver circuits 32. Each column-driver circuit 32 is electrically connected to a separate and independent column line 38 that is connected in common to all of the pixels 20 in a corresponding column of pixels 20. The column-driver circuits 32 can include, for example, driving transistors capable of providing an electrical column signal that can communicate data to the column line 38 and to its corresponding column of pixels 20. Thus, the column-driver circuit 32 provides information through its connected column line 38 to the corresponding column of pixels 20. The column lines 38 are electrical conductors such as wires capable of communicating signals from the column-driver circuits 32 to the pixels 20 in the column of pixels 20 associated with the column-driver circuit 32.

The system controller 50 can provide information and control signals to the column-control circuit 30 either serially or in parallel through electrical conductors or a bus, for example as illustrated with data lines 34. The system controller 50 can also provide a control bit (or a token) to the row-select circuit 40 that is shifted serially through the serial shift register 42 of the row-select circuit 40 to select sequential rows of pixels 20, for example with a row-control circuit 49 that can be a part of the system controller 50 (for example a circuit in an integrated circuit) or can be a separate circuit.

The row-select circuit 40 can be a digital circuit including an analog or digital serial shift register 42 including row storage elements 44 such as flip-flops, digital latches, or capacitors for shifting a row select signal into alignment with the rows of pixels 20 in the array. The row-select circuit 40 can be an integrated circuit or include other discrete electronic components and can be responsive to the system controller 50. Each row storage element 44 is electrically connected to a separate and independent row-select line 48 that is connected in common to all of the pixels 20 in a corresponding row of pixels 20. The row storage elements 44 store a value and can include, for example, capacitors for storing a charge, flip-flops, latches, or digital latches for storing a digital value, and driving transistors capable of providing an electrical row select signal to the row-select line 48 in response to the stored value in the row storage elements 44. The row-select lines 48 are electrical conductors such as wires capable of communicating signals from the row-select circuits 40 and row storage elements 44 to the pixels 20 in the row of pixels 20 associated with the row storage elements 44.

A row-control circuit 49 provides a row select signal (for example a charge or a digital value) that is shifted into the serial shift register 42 of the row-select circuit 40 through a select control line 46, such as a wire or other conductors in response to a clock 14; for example, provided by the system controller 50. The row-control circuit 49 can be a part of the system controller 50, for example part of an integrated circuit, or not. Alternatively, the row-control circuit 49 can be an independent integrated circuit or provided in discrete logic.

In an embodiment of the present invention, the light elements 60 are light emitters such as light-emitting diodes (LEDs) or micro-LEDs. In another embodiment, the light elements 60 are light sensors such as photo-sensors sensitive to visible light, infrared light, ultraviolet light, x-rays, or electromagnetic radiation. As used herein, a light sensor is sensitive to visible electromagnetic radiation (i.e., visible light) or non-visible electromagnetic radiation (e.g., infrared light, ultraviolet light, or x-rays). A light sensor is any device that converts incident electromagnetic radiation to an electrical signal (e.g., voltage or current) and is not limited to particular classes of photo-sensors such as photo-diodes.

Matrix-addressed systems 10 of the present invention can be addressed using passive-matrix addressing or active-matrix addressing. In a passive-matrix address scheme, each pixel 20 (e.g., light emitter or light sensor) is directly addressed using the row-select line 48 and column line 38. When data (information) is written to a row, the row-select line 48 corresponding to the row selects all of the pixels 20 in the row and each of the column lines 38 provides the data or information (for example an analog voltage or current) to each of the pixels 20 in the row. The next row is then selected and the process repeated for each row. Thus, in a passive-matrix controlled device the light elements 60 are only active when they are part of a selected row. In an analog arrangement, the column-control circuit 30 can include a serially connected analog shift register using charged capacitors to provide the information. In an embodiment of the present invention, the column-control circuit 30 and the row-select circuit 40 provide passive-matrix control to the array of pixels 20.

In an active-matrix address scheme of the present invention, each pixel 20 (e.g., light emitter or light sensor) includes some circuit for information storage. The information is provided by the column line 38 to each pixel 20 in a row that is selected by the row-select line 48 under the control of the row-select circuit 40. When data (information) is written to a row, the row-select line 48 corresponding to the row selects all of the pixels 20 in the row and each of the column lines 38 provides the data or information (for example an analog voltage or current or a digital value) to each of the pixels 20 in the row. Each of the pixels 20 then stores the analog voltage, current, charge, or digital value and uses the stored value to drive the pixel's light element 60 (e.g., a light emitter or light sensor). The next row is then selected and the process repeated for each row. Thus, in an active-matrix controlled device the light elements 60 can be active when they are not selected since the information used to control the light elements 60 is stored and available in the pixel 20 even when the pixel 20 is not selected. In an analog arrangement, the column-control circuit 30 and the row-select circuit 40 can each include a serially connected analog shift register using charged capacitors to provide the information or row-select signals and the pixel 20 can include a storage circuit to store the information, for example in a capacitor. In a digital implementation, the column-control circuit 30 can include a serially connected digital shift register using flip-flops or digital latches to provide the information and the pixel 20 can include a storage circuit (e.g., pixel storage element 26) to store the information, for example in a flip-flop or digital latch. In an embodiment of the present invention, the column-control circuit 30 and the row-select circuit 40 provide active-matrix control to the array of pixels 20.

In embodiments of the present invention, each pixel 20 includes a pixel circuit 24 that is connected to the light elements 60 of the pixel 20, that is connected to the column-driver circuit 32 corresponding to the column in which the pixel 20 is arranged, for example through the column lines 38, and that is connected to the row-select line 48 corresponding to the row in which the pixel 20 is arranged. The pixel circuit 24 can include a pixel storage element 26 that stores information in response to signals provided by the row-select line 48 and column-driver circuit 32 to which it is connected by the column line 38. The pixel storage element 26 can include (in an analog embodiment) a capacitor or (in a digital embodiment) a flip-flop or latch such as a digital latch. The pixel storage elements 26 can be the same kind of storage circuit as the row storage elements 44, or they can be different.

Figure 2:
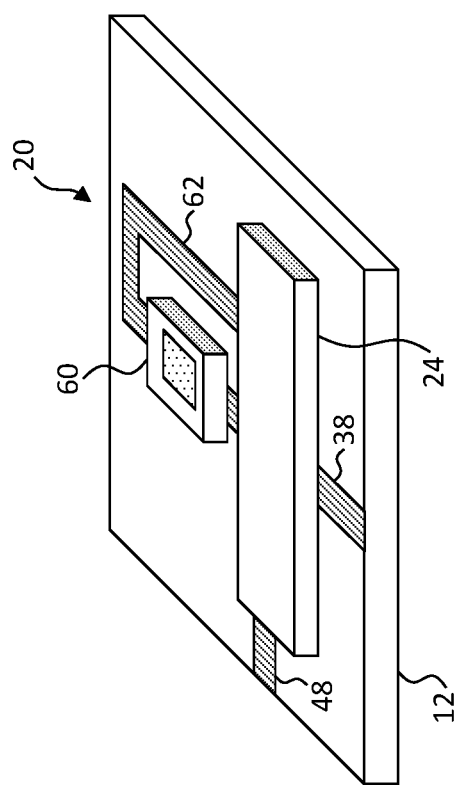
FIG. 2 is a perspective of a pixel structure according to an embodiment of the present invention corresponding to FIG. 1.
Figure 3:
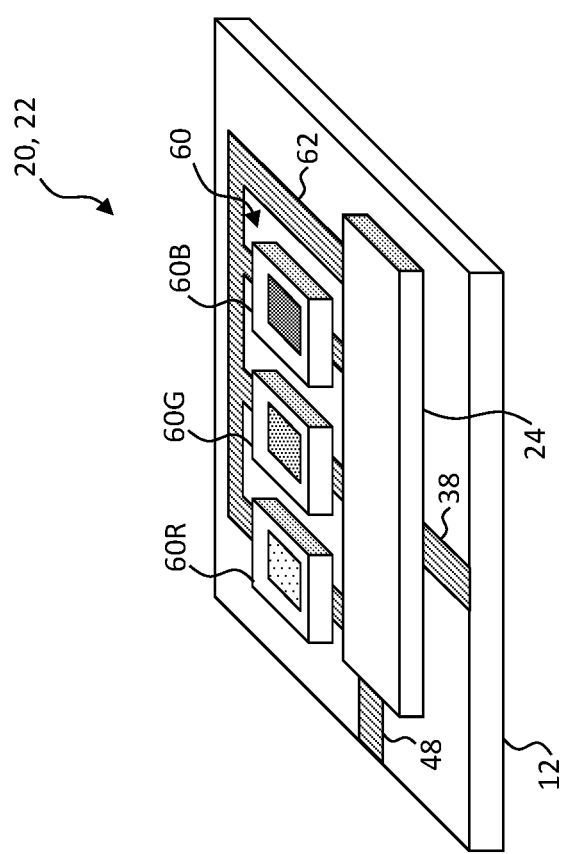
FIG. 3 is a perspective of a pixel structure having multiple light elements according to an embodiment of the present invention.

Referring to FIG. 2, in an embodiment of the present invention, the light elements 60 are light-emitting diodes (LEDS, for example micro-LEDs) that are formed in or on one or more light element substrates that are separate, distinct, and independent of the system substrate 12. Likewise, the pixel circuit 24 can be formed in or on one or more pixel substrates that are separate, distinct, and independent of the system substrate 12. The various separate, distinct, and independent substrates of embodiments of the present invention can be bare die, for example, unpackaged integrated circuit substrates such as semiconductor substrates. FIG. 2 illustrates an embodiment with a single light element 60 controlled by each pixel circuit 24 in each pixel 20. In another embodiment illustrated in FIG. 3, each pixel circuit 24 in each pixel 20 can control a plurality of light elements 60; for example, corresponding to red, green, or blue light elements 60R, 60G, 60B such as red, green, or blue light emitters that emit red, green, or blue light, respectively, or red, green, or blue light sensors that are sensitive to red, green, or blue light, respectively, to form a full-color pixel 20. In FIGS. 2 and 3, the light elements 60 can be electrically connected to the pixel circuit 24 through electrical conductors 62, such as wires formed by photolithography or cured ink deposited by inkjet devices.

Figure 4:
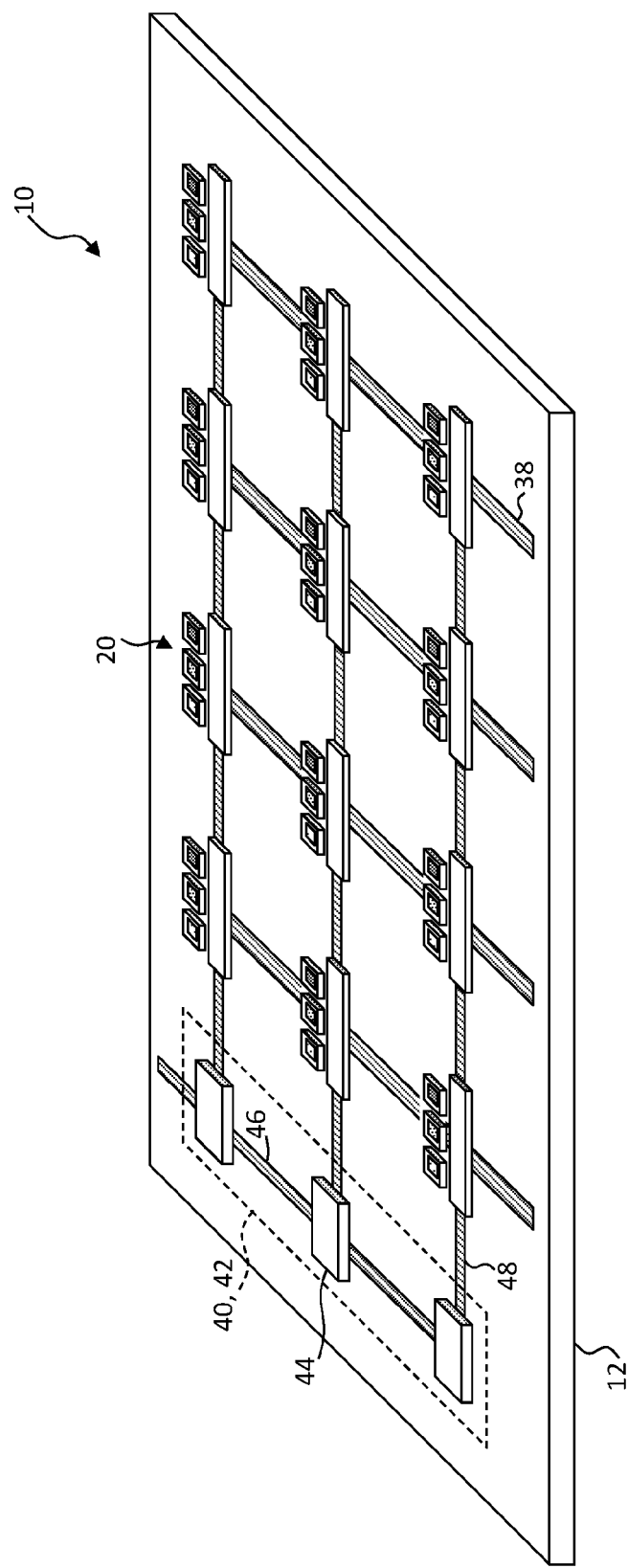
FIG. 4 is a perspective of a matrix-addressed system structure having multiple light elements and separate and independent row storage element substrates according to an embodiment of the present invention.

Referring to FIG. 4, the pixels 20 of FIG. 3 are distributed in an array having pixel rows and pixel columns on the system substrate 12 (for clarity, the conductors 62 are not shown). In a further embodiment, the row-select circuit 40 is formed in or on one or more row-select substrates that are separate, distinct, and independent of the system substrate 12. The row-select circuit 40 can include a plurality of serially connected separate, distinct, and independent row-select substrates that each includes a row storage element 44 and provides one or more but less than all of the row-select lines 48. In the example embodiment of FIG. 4, each row-select substrate includes one row storage element 44 and therefore provides one of the row-select lines 48. In alternative embodiments, a row-select substrate can include multiple row storage element 44 and therefore provides a corresponding multiple of the row-select lines 48, since each row storage element 44 includes or is connected to one row-select lines 48, for example, with a drive transistor. The drive transistor can be considered a part of the row storage element 44, or can be a separate part that connects the row storage element 44 to the corresponding row-select line 48.

Figure 5:
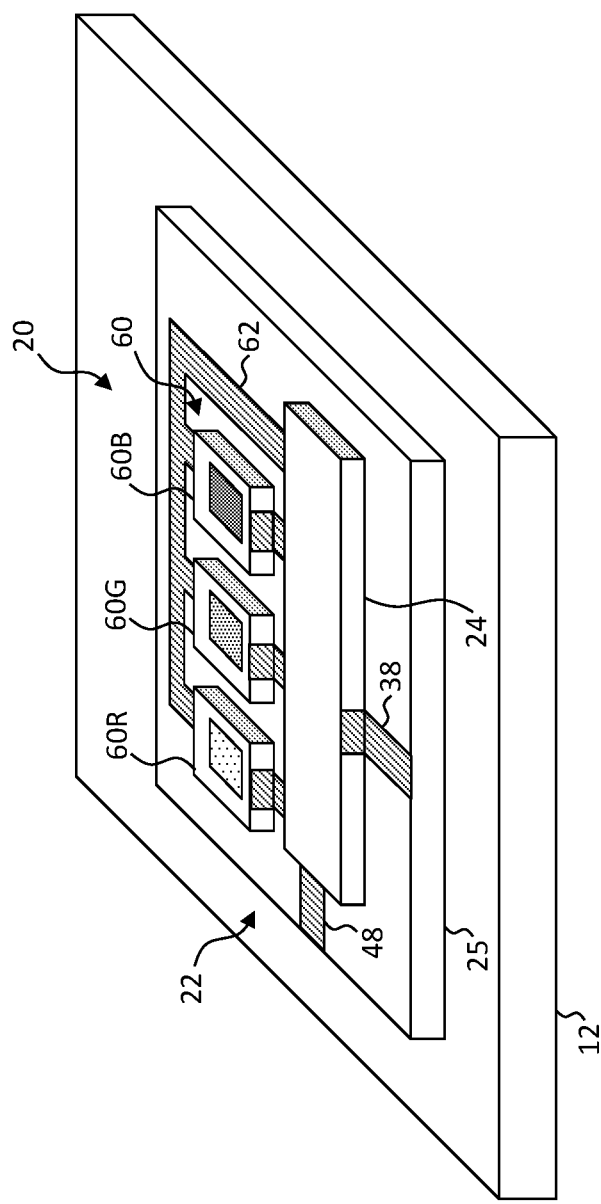
FIG. 5 is a perspective of a pixel structure having a pixel module substrate according to an embodiment of the present invention.
Figure 6:
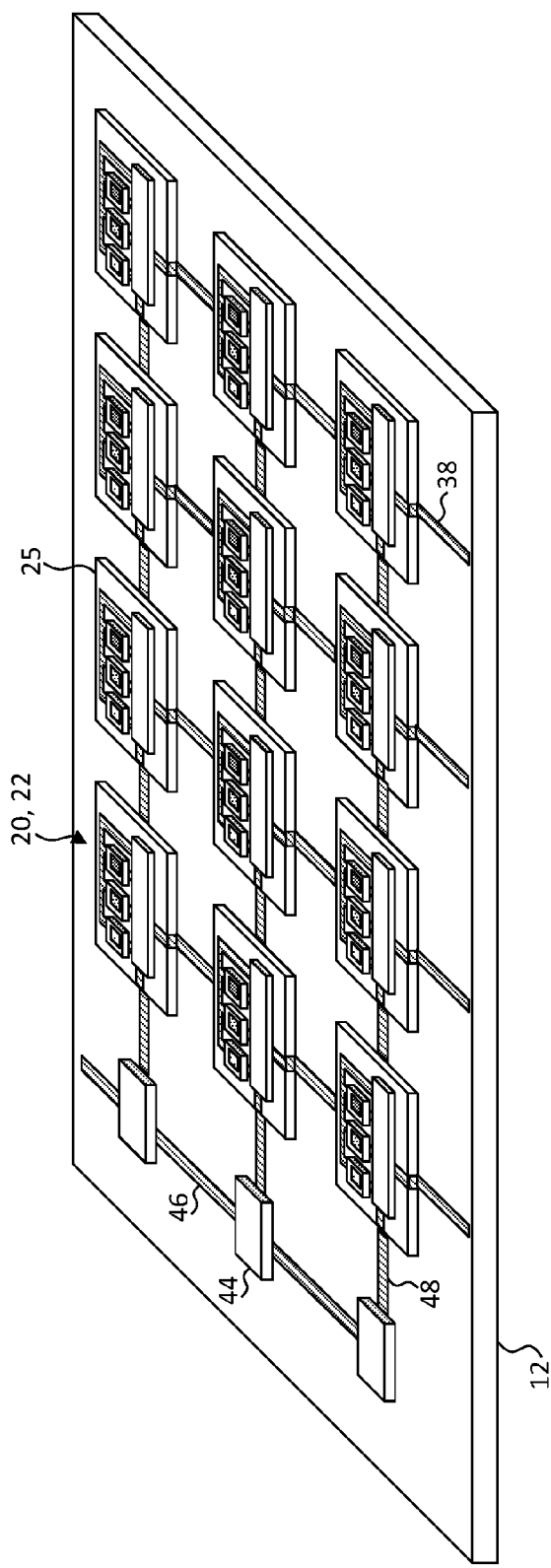
FIG. 6 is a perspective of a matrix-addressed system structure having a pixel module substrate according to an embodiment of the present invention.

In the embodiments of FIGS. 2, 3, and 4, the pixel substrates and the light element substrates are disposed on the system substrate 12, as are the row storage elements 44. Referring to FIGS. 5 and 6, in an alternative embodiment of the present invention, the pixel circuit 24 and the light elements 60 are disposed on a pixel module substrate 25 separate and distinct from the system substrate 12, the pixel substrate, and the light elements 60 (i.e., the substrate of the light elements 60). The pixel module substrate 25 is disposed on the system substrate 12. Thus, the pixel circuit 24 and light elements 60 are electrically connected on the pixel module substrate 25 and the pixel module substrate 25 is electrically to the system substrate 12, thereby electrically connecting the pixel circuits 24 and light elements 60 to the column line 38 and row-select line 48 as appropriate. The system substrate 12 can therefore be non-native to any combination of the light elements 60 (e.g., micro-LEDs), the pixel circuit 24 (e.g., the pixel substrates), the pixels 20, the pixel module substrate 25, or the row storage elements 44.

Figure 7:
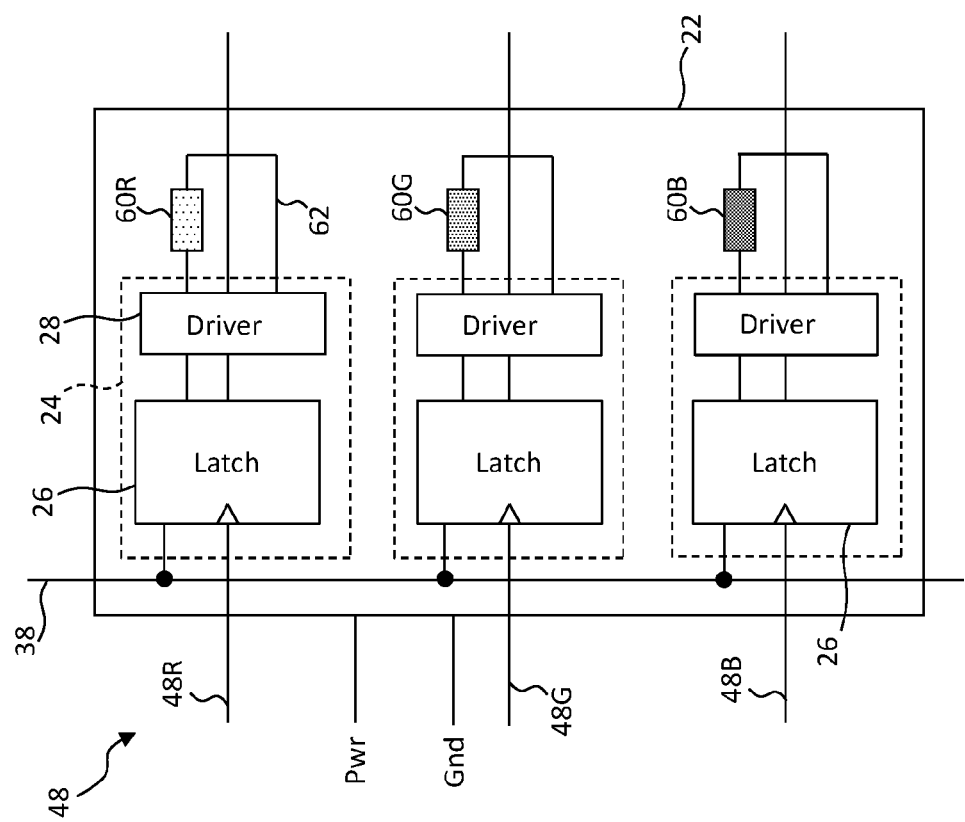
FIG. 7 is a schematic diagram of a pixel circuit according to an embodiment of the present invention corresponding to FIG. 1.

In the embodiment of FIG. 1, a full-color pixel module 22 includes three pixels 20, a pixel 20R, a pixel 20G, and a pixel 20B and each having a separate pixel circuit 24. The pixel circuits 24 can be logically or physically separate as shown in FIG. 2. Alternatively, a common pixel circuit 24, a common integrated circuit, or a common pixel substrate can be used, as shown in FIGS. 3-6. Referring to FIG. 7, each of the pixel circuits 24 are combined into a common pixel circuit 24 and provided on a common integrated circuit pixel substrate. In this arrangement, a different row-select line 48 is used, for example row-select lines 48R, 48G, 48B corresponding to each of the light elements 60R, 60G, 60B respectively to form a full-color pixel module 22.

Figure 8:
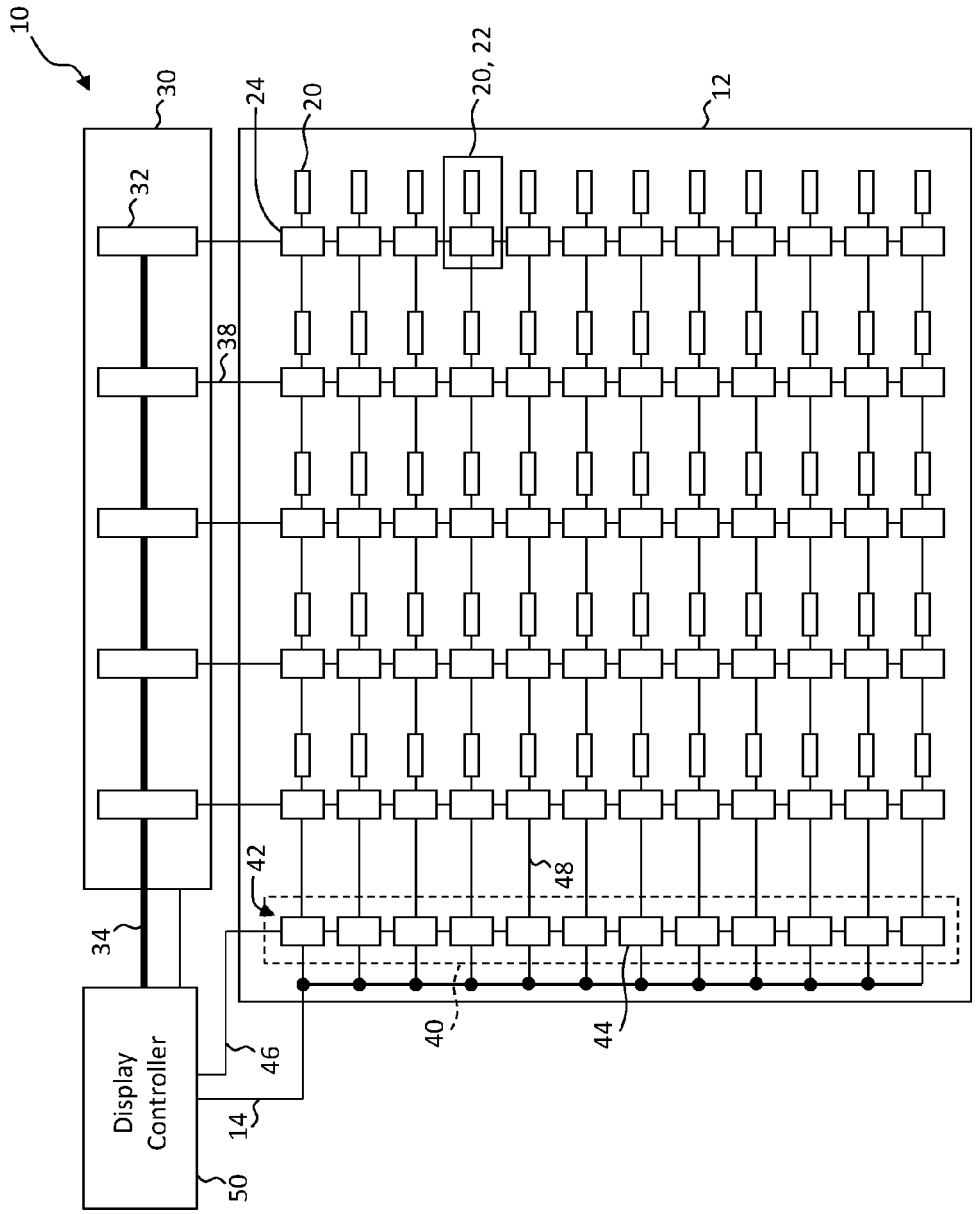
FIG. 8 is a schematic diagram of another embodiment of the present invention.
Figure 9:
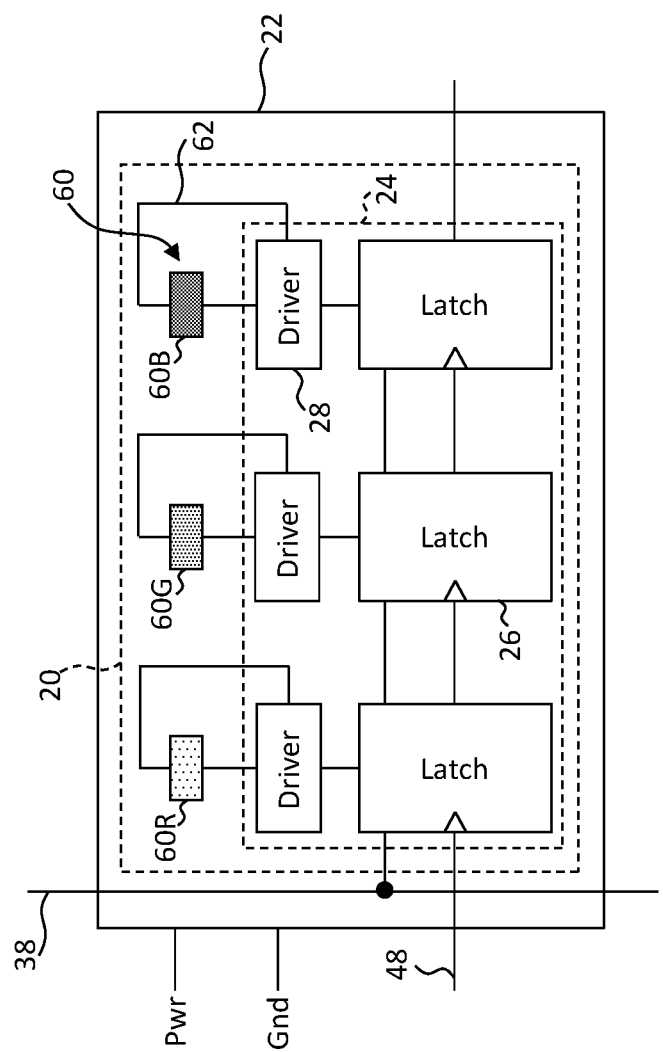
FIG. 9 is a schematic diagram of a pixel circuit according to an embodiment of the present invention corresponding to FIG. 8.

In an alternative embodiment, referring to FIGS. 8 and 9, a single row-select line 48 can be used to communicate a data value to each of multiple light elements 60. As shown in FIG. 9, a series of pixel storage elements 26 are serially connected to form a pixel serial shift register (different from the serial shift register 42 of the row-select circuit 40). First data (for example blue data) is provided on the column line 38 and the row-select line 48 is enabled to load the blue data value into the first pixel storage element 26 in the pixel serial shift register. Second data (for example green data) is then provided on the column line 38 and the row-select line 48 is enabled a second time to load the green data value into the first pixel storage element 26 in the pixel serial shift register while the blue data value is serially shifted into the second pixel storage element 26. Third data (for example red data) is then provided on the column line 38 and the row-select line 48 is enabled a third time to load the red data value into the first pixel storage element 26 in the pixel serial shift register while the green data value is serially shifted into the second pixel storage element 26 and the blue data value is serially shifted into the third pixel storage element 26. In an embodiment, the pixel circuit 24 and light elements 60 of FIG. 9 form a single pixel 20. In an alternative embodiment, the pixel circuit 24 and light elements 60 of FIG. 9 form a plurality of pixels 20, for example three pixels 20, in a common row. The embodiment of FIG. 9 has the advantage of requiring fewer row-select lines 48.

The row-select circuit 40 can be implemented in a variety of ways. In one simple way, a serial shift register 42 with a common clock 14 is used, for example as illustrated in FIG. 1 where each of the row storage elements 44 is a flip flop (such as a D flip-flop) whose input is connected to the previous row storage element 44 in the serial shift register 42 and whose output is connected to the following row storage element 44 in the serial shift register 42.

Figure 10:
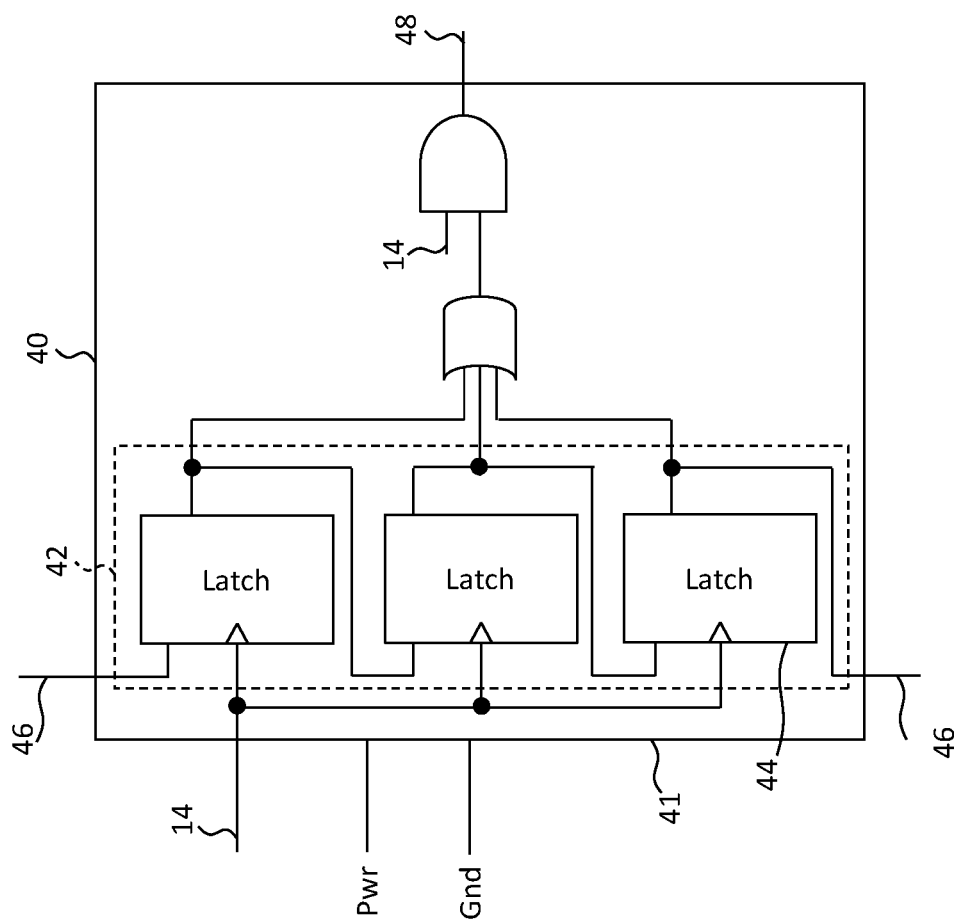
FIG. 10 is a schematic diagram of a row-select circuit according to an embodiment of the present invention.

In the alternative embodiment of FIGS. 8 and 9, each row-select line 48 is enabled three times to enter the data value on the column line 38 and clock the data value into the corresponding pixel 20. Therefore, the row-select circuit 40 must provide a repeated row-select line 48 signal on each row-select line 48. Referring to FIG. 10, each row storage element 44 is serially connected to a previous and a following row storage element 44 and has a common clock signal to transfer a row select control bit through the serial shift register 42. The row storage elements 44 are grouped into sets of three all of whose outputs are combined (for example using an OR logic circuit) to provide the repeated row select signal on the row-select line 48. To ensure that the row-select line 48 toggles three times as opposed to simply being held high for three clock cycles, it is combined with the clock 14 using an AND gate. In an embodiment of the present invention, the groups of three row storage elements 44 are provided in a row-select module 41 formed in a common integrated circuit and on a common substrate.

Figure 11:
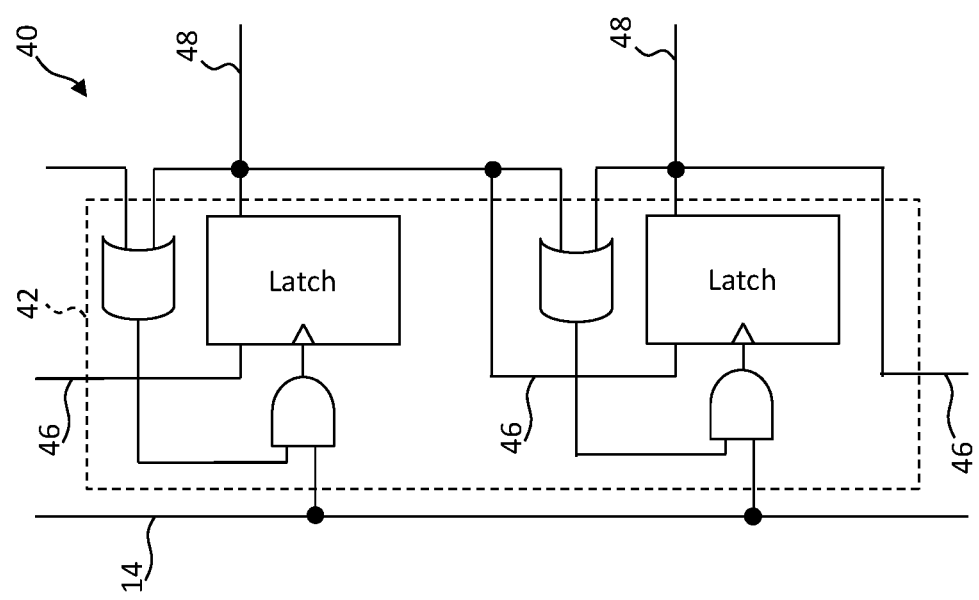
FIG. 11 is a schematic diagram of another row-select circuit according to another embodiment of the present invention.

However, in general, only a single row of the array of pixels 20 is selected at a time, so that only one row-select line 48 is active in the row-select circuit 40 at a time. Thus, only one row select control bit is passed through the serial shift register 42 at a time and only those row storage elements 44 whose stored value are changing need be active, as shown in FIG. 11. By limiting the number of row storage elements 44 that are active at a time, power consumption is reduced in the matrix-addressed system 10. However, in such an arrangement, at least initially the first row storage element 44 in the serial shift register 42 is active so that the row select control bit can be transferred into the serial shift register 42.

Referring to FIG. 11, at least a portion of the row-select circuit 40 is illustrated. The row storage elements 44 are serially connected but the clock that transfers data into each row storage element 44 is a combination of the system clock 14 and the stored values of the previous and current row storage elements 44 in the serial shift register 42. Thus, a row storage element 44 is only clocked if the previous row storage element 44 in the serial shift register 42 stores the row select control bit (so that the row storage element 44 can input the row select control bit) or if the row storage element 44 in the serial shift register 42 stores the row select control bit (so that the row storage element 44 can remove the row select control bit). In this embodiment, only two row storage elements 44 need be active at a time (ignoring the first row storage element 44 in the serial shift register 42).

Figure 12:
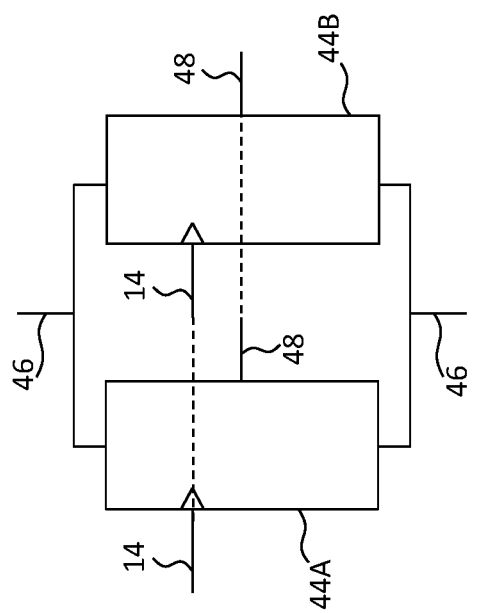
FIG. 12 is a schematic diagram of a redundant row storage element in a redundant row-select circuit according to an embodiment of the present invention.

According to an embodiment of the present invention and referring to FIG. 12, a redundant row storage element 44B is connected in parallel with each row storage element 44A to form a redundant row-select circuit 40. If one of the row storage modules is not functional, a single serial shift register 42 can fail. By providing two row storage elements 44 connected in parallel, if one fails the other can provide a functional row storage element 44. The redundant row storage elements 44 can form a redundant serial shift register 42 and redundant row-select circuit 40.

In operation, the embodiment of FIG. 1 is controlled by the system control 50. The system controller 50 provides a first row of data, for example image data, to the column-control circuit 30, for example by shifting sequential pixel data values through a shift register until the pixel data values in the row are stored in the column-control circuit 30 in alignment with the column-driver circuit 32 connected to the column line 38 and connected to the column of pixels 20 corresponding to the pixel data value in the row. The pixel data values are presented by the column-driver circuit 32 through the column line 38 to the columns of pixels 20. An enabling row select control bit (e.g., a one or HIGH signal) is shifted into the first row storage element 44 in the row-select circuit 40 by the row-control circuit 49 through the select control line 46. The row select control bit is stored in the first row storage element 44 in the serial shift register 42 and the output of the first row storage element 44 is driven, for example by a transistor, onto the row-select line 48, forming a clock signal for the first row of pixels 20 that transfers the pixel data values provided by the column-driver circuit 32 in the column-control circuit 30 through the column line 38 into the pixel circuits 24 of the pixels 20. The pixel circuits 24 then drive the light elements 60 with the stored pixel data values.

A second row of pixel data values is then loaded into the column-control circuit 30 (either after or during the row-select process; the column-control circuit 30 can have a double-buffered loading circuit). A disabling row select control bit (e.g., a zero or LOW signal) is shifted into the first row storage element 44 in the row-select circuit 40 by the row-control circuit 49 through the select control line 46 and the enabling control bit in the first row storage element 44 is shifted into the second row storage element 44 of the serial shift register 42 in response to the system clock 14. The row select control bit stored in the second row storage element 44 in the serial shift register 42 is driven onto the row-select line 48, forming a clock signal for the second row of pixels 20 that transfers the pixel data values provided by the column-driver circuit 32 in the column-control circuit 30 through the column line 38 into the pixel circuits 24 of the pixels 20 in the second row. The pixel circuits 24 in the second row then drive the light elements 60 with the stored pixel data values. Note that the pixel circuits 24 in the first row continue to drive their light elements 60 with their stored pixel data values. Hence, this embodiment provides active-matrix control.

The process repeats for each successive row of pixels 20 as the row select control bit is shifted through the serially connected row storage elements 44 of the serial shift register 42 until all of the rows of image data are stored in their corresponding rows of pixels, after which the process is repeated for another image.

In an embodiment of a full-color display for full-color images, each red, green, and blue pixel 20R, 20G, 20B is treated as a separate row of pixels 20. For example, the red pixels 20 of the first image row are first loaded into the red pixel circuits 24 of the first pixel row, the green pixels 20 of the first image row are loaded into the green pixel circuits 24 of the second pixel row, the blue pixels 20 of the first image row are loaded into the blue pixel circuits 24 of the third pixel row, the red pixels of the second image row are loaded into the red pixel circuits 24 of the fourth pixel row, the green pixels of the second image row are loaded into the green pixel circuits 24 of the fifth pixel row, the blue pixels of the second image row are loaded into the blue pixel circuits 24 of the sixth pixel row, and so on as illustrated in FIG. 1.

The operation of the embodiment of FIG. 8 is similar except that each row-select line 48 is enabled three times by the row-select circuit 40 (FIG. 10) to load multiple pixel data values into the pixel circuits 24 (FIG. 9). The operation of the column-control circuit 30 does not need to change. Note that although FIGS. 9 and 10 illustrate storing three values in the pixel circuit 24 of a pixel 20 (for example red, green, and blue values of a full-color pixel 20), any number of values can be stored; for example, pixel data values corresponding to multiple full-color pixels 20.

In both the embodiments of FIG. 1 and FIG. 8, if the light elements 60 are light sensors, for example photo-sensors, the row-selected pixel circuits 24 output data values stored in the pixel storage elements 26 onto the column lines 38 and the output of the pixel serial shift register is connected to the column line 38 rather than the input. The column-driver circuits 32 for each pixel column then transfers the received data values and transfers them with the column-control circuit 30 into the system controller 50. The row-select process and control is the same and the column-control circuit 30 operates in reverse, inputting data rather than outputting data. In other embodiments of the present invention, the light elements 60 are not restricted to the input or output of electromagnetic radiation. For example, the light elements 60 can be transducers of various types of energy, including electrical fields, magnetic fields, mechanical, electrical, and thermal energy. In an embodiment of the present invention, the matrix-addressed system 10 of the present invention is an area sensor such as a touchscreen sensor responsive to touches; for example touches indicated by changes in electrical fields such as are found in capacitive touch screens. A pixel 20 can be an output or an input device. Hence, embodiments of the present invention can be applied to any matrix-addressed system.

Figure 13:
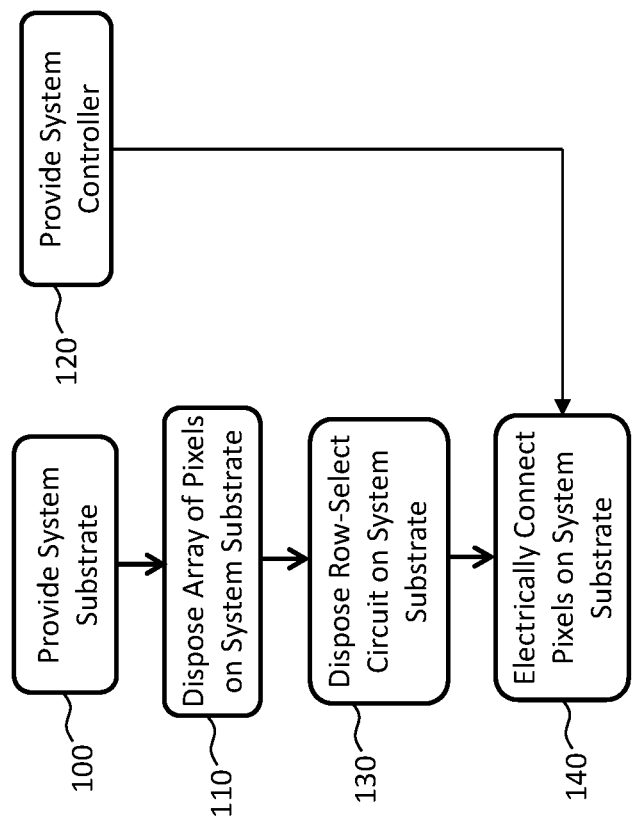
FIGS. 13 and 14 are flow diagrams according to embodiments of the present invention.

In an embodiment of the present invention, and referring to FIG. 13, a method of making a matrix-addressed system 10 includes providing a system substrate 12 in step 100 and disposing an array of pixels 20 on the system substrate 12 in step 110. The array of pixels 20 can be disposed on the system substrate 12 by micro-transfer printing, for example micro-transfer printing chiplets, bare die, or unpackaged integrated circuits. The row-select circuit 40 is disposed on the system substrate 12 in step 130; for example by forming the row-select circuit 40 on the system substrate 12, locating components on the system substrate 12, for example, using pick-and-place techniques for discrete or integrated circuit components, or by micro-transfer printing one or more circuits, for example micro-transfer printing a plurality of bare die chiplets or integrated circuits, each chiplet including one or more row storage elements 44. In an embodiment, the row-select circuit 40 is micro-transfer printed onto the system substrate 12 by printing a plurality of row-select substrates onto the system substrate 12. The row-select substrates each include at least a portion of the row-select circuit 40. In step 120 a system controller 50 is provided and the system controller 50, the pixels 20, and the row-select circuit 40 are electrically connected in step 140, for example, using photolithographic techniques.

Figure 14:
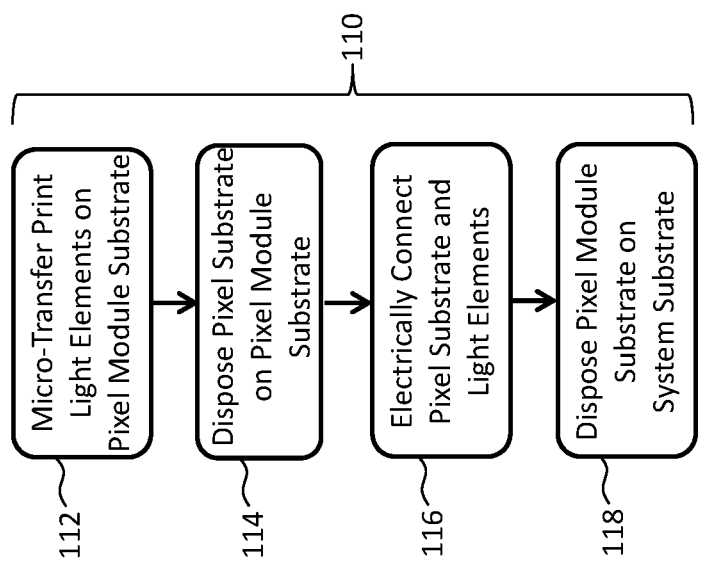

Referring to FIG. 14 in a further embodiment of the present invention, the step 110 of disposing the array of pixels 20 on the system substrate 12 can include the steps of micro-transfer printing the light elements 60 onto a pixel module substrate 25 in step 112. The pixel module substrate 25 can be a semiconductor substrate such as a wafer or a glass, plastic, metal, or ceramic substrate. The pixel circuits 24 can also be formed on a pixel substrate and micro-transfer printed onto the pixel module substrate 25 in step 114 and electrically connected to the light elements 60, for example using photolithography in step 116. The pixel module substrate 25 is then disposed on the system substrate 12 in step 118, for example, by micro-transfer printing or using pick-and-place techniques, and then electrically connected to the system substrate 12, system controller 50, and column-control circuit 30.

In another embodiment of the present invention, a matrix-addressed system 10 includes an array of pixels 20 arranged in rows and columns and a column-control circuit 30 for providing information to or receiving information from the pixels 20. The column-control circuit 30 includes a separate column-driver circuit 32 connected to each column of pixels 20 that provides or receives information in common to all of the pixels 20 in the column. A row-select circuit 40 is disposed on the system substrate 12. The row-select circuit 40 includes a serial shift register 42 having a number of row storage elements 44 equal to or larger than the number of rows in the array of pixels 20. Each row storage element 44 in the shift register has a row-select line 48 connected to all of the pixels 20 in a row. In one arrangement, the pixels 20 and the row select circuit 40 are disposed on a system substrate 12, for example using micro-transfer printing.

The row-select circuit 40, or portions of it such as one or more row storage elements 44, the pixel circuits 24, or light elements 60 can be made in one or more integrated circuits having separate, independent, and distinct substrates; for example, bare die. For example, they can be chiplets, small, unpackaged integrated circuits such as unpackaged dies interconnected with wires connected to contact pads on the chiplets. The chiplets can be disposed on an independent substrate, such as a backplane or system substrate 12. In an embodiment, the chiplets are made in or on a semiconductor wafer and have a semiconductor substrate and the system substrate 12 is or includes glass, resin, polymer, plastic, or metal. Semiconductor materials (for example silicon or GaN) and processes for making small integrated circuits are well known in the integrated circuit arts. Likewise, backplane substrates and means for interconnecting integrated circuit elements on the system substrate 12 are well known in the printed circuit board arts. The chiplets can be applied to the system substrate 12 using micro transfer printing.

In useful embodiments the system substrate 12 includes material, for example glass or plastic, different from a material in an integrated-circuit substrate; for example, a semiconductor material such as silicon or GaN. The light emitters 60 can be formed separately on separate semiconductor substrates, assembled onto the pixel module substrate 25, for example by micro-transfer printing, and then the assembled unit is located on the surface of the system substrate 12. This arrangement has the advantage that the light elements 60 can be separately tested on the pixel module substrate 25 and the pixel module substrates 25 accepted, repaired, or discarded before the pixel module substrate 25 is located on the system substrate 12, thus improving yields and reducing costs.

In one method of the present invention, the pixel module substrates 25 are formed and disposed on the system substrate 12 by micro transfer printing using compound micro assembly structures and methods, for example as described in U.S. patent application Ser. No. 14/822,868 filed Aug. 10, 2015, entitled Compound Micro-Assembly Strategies and Devices. Alternatively, the pixel module substrates 25 are disposed on the system substrate 12 using pick-and-place methods found in the printed-circuit board industry, for example using vacuum grippers. The pixel module substrates 25 on the system substrate 12 can be interconnected using photolithographic methods and materials or printed circuit board methods and materials.

In an embodiment, the light element drive circuits 28 drive the light elements 60 with a current-controlled drive signal. The current-controlled drive signal can convert an analog value (e.g., a charge stored in a capacitor analog pixel storage element 26) to a current drive signal or, as shown, the current-controlled drive signal can convert a digital bit value (e.g., a voltage stored in a flip-flop or latch digital pixel storage element 26) to a current drive signal, thus forming a bit-to-current convertor. Current-drive circuits, such as current replicators, are known in the art and can be controlled with a pulse-width modulation scheme whose pulse width is determined by the digital bit value. A separate light element drive circuit 28 can be provided for each light element 60, as shown, or a common light element drive circuit 28, or a light element drive circuit 28 with some common components, can be used to drive the light elements 60 in response to the data values stored in the pixel storage elements 26. A power connection, a ground connection, a data input (e.g., column data 38), and a clock signal (e.g., a signal on the row-select line 48) control the pixel storage element 26. In the serially connected embodiment (FIG. 6), data values are transferred through the pixel storage elements 26 of the pixel circuit 24 by clocking the flip-flops.

The system controller 50 can include a memory for storing calibration and display pixel data values for the display that are communicated to the column-control circuit 30.

Although not specifically illustrated in the Figures or as a method step, the provision of the matrix-addressed system 10 can include forming conductive wires on the system substrate 12 or pixel module substrate 25 using photolithographic and display substrate processing techniques; for example, photolithographic processes employing metal or metal oxide deposition using evaporation or sputtering, curable resin coatings (e.g. SU8), positive or negative photoresist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The conductors 62, or wires, can be fine interconnections, for example having a width of less than 50 microns, less than 20 microns, less than 10 microns, less than five microns, less than two microns, or less than one micron. Such fine interconnections are useful for interconnecting chiplets, for example as bare dies with contact pads and used with the system substrate 12 or pixel module substrate 25. Alternatively, wires can include one or more crude lithography interconnections having a width from 2 µm to 2 mm, wherein each crude lithography interconnection electrically connects the light elements 60, pixel circuits 24, or row-select circuit 40 to the system substrate 12 or pixel module substrate 25.

The system controller 50 can be external to the system substrate 12 (for example on a separate printed circuit board substrate). In this embodiment, the system controller 50 can be electrically connected to the conductors 62 including row-select lines 48 and column lines 38 using connectors, ribbon cables, or the like). In an alternative embodiment, not shown, the system controller 50 is located on the system substrate 12 outside the system substrate area defined by the array of pixels 20. In this alternative, the system controller 50 is electrically connected to the conductors 62 including row-select lines 48 and column lines 38 using wires and buses, for example, using surface mount and soldering technology.

In an embodiment, the light elements 60 (e.g. micro-LEDs or micro-photo-sensors) are transfer printed to the pixel module substrates 25 or the system substrate 12 in one or more transfers. For a discussion of micro-transfer printing techniques see, U.S. Pat. Nos. 8,722,458, 7,622,367 and 8,506,867, each of which is hereby incorporated by reference. The transferred light elements 60 are then interconnected, for example with conductors 62 including row-select lines 48 and column lines 38 and optionally including connection pads and other electrical connection structures, to enable the system controller 50 to electrically interact with the light elements 60 to emit or receive light in the matrix-addressed system 10 of the present invention. In an alternative process, the transfer of the light elements 60 is performed before or after all of the conductors 62 are in place. Thus, in embodiments, the construction of the conductors 62 can be performed before the light elements 60 are printed or after the light elements 60 are printed or both.

According to various embodiments of the present invention, the system substrate 12 usefully has two opposing smooth sides suitable for material deposition, photolithographic processing, or micro-transfer printing of micro-LEDs or photo-sensors. The system substrate 12 can have a size of a conventional display or sensor array, for example, a rectangle with a diagonal of a few centimeters to one or more meters. Such substrates are commercially available. The system substrate 12 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present invention, the light elements 60 emit or receive light through the system substrate 12. In other embodiments, the light elements 60 emit or receive light in a direction opposite the system substrate 12. The system substrate 12 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. According to embodiments of the present invention, the system substrate 12 can include layers formed on an underlying structure or substrate, for example a rigid or flexible glass or plastic substrate.

In an embodiment, the system substrate 12 can have a single, connected, contiguous system substrate area that includes the light elements 60 and the light elements 60 each have a light-emissive or light-receptive area. The combined light-emissive areas of the plurality of light elements 60 is less than or equal to one-quarter of the contiguous system substrate area. In further embodiments, the combined light-emissive or light-receptive areas of the plurality of light elements 60 is less than or equal to one eighth, one tenth, one twentieth, one fiftieth, one hundredth, one five-hundredth, one thousandth, one two-thousandth, or one ten-thousandth of the contiguous system substrate area. The light-emissive or light-receptive area of the light elements 60 can be only a portion of the light elements 60. In a typical light-emitting diode, for example, not all of the semiconductor material in the light-emitting diode necessarily emits light. Therefore, in another embodiment, the light elements 60 occupy less than one quarter of the system substrate area.

In an embodiment of the present invention, the light elements 60 are micro-light-emitting diodes (micro-LEDs)

or photo-sensors, for example, having light-emissive or light-sensitive areas of less than 10, 20, 50, or 100 square microns. In other embodiments, the light elements 60 have physical dimensions that are less than 100 μm, for example having a width from 2 to 5 μm, 5 to 10 μm, 10 to 20 μm, or 20 to 50 μm, having a length from 2 to 5 μm, 5 to 10 μm, 10 to 20 μm, or 20 to 50 μm, or having a height from 2 to 5 μm, 4 to 10 μm, 10 to 20 μm, or 20 to 50 μm. The light elements 60 can have a size of one square micron to 500 square microns. Such micro-light elements 60 have the advantage of a small light-emissive or light-sensitive area compared to their brightness or sensitivity. Moreover, light elements 60 that are micro-light-emitting diodes can provide excellent color purity, highly saturated colors, and a substantially Lambertian emission providing a wide viewing angle.

According to various embodiments, the matrix-addressed system 10, for example as used in a display or sensor array of the present invention, includes a variety of designs having a variety of resolutions, light element 60 sizes, and a range of system substrate areas. For example, system substrate areas ranging from 1 cm by 1 cm to 1 m by 1 m in size are contemplated. In general, larger light elements 60 are most useful, but are not limited to, larger system substrate areas. The resolution of light elements 60 over a system substrate 12 can also vary, for example from 50 light elements 60 per inch to hundreds of light elements 60 per inch, or even thousands of light elements 60 per inch. For example, a three-color display can have one thousand 10μ×10μ light emitters 60 per inch (on a 25-micron pitch). Thus, the present invention has application in both low-resolution and very high-resolution displays or sensor arrays. An approximately one-inch 128-by-128-pixel display having 3.5 micron by 10-micron emitters has been constructed and successfully operated without redundant emitters as described in U.S. patent application Ser. No. 14/743,981, filed Jun. 18, 2015, entitled Micro Assembled LED Displays and Lighting Elements.

In an embodiment, the light elements 60 are separately formed in a semiconductor wafer. The light elements 60 are then removed from the wafer and transferred, for example, using micro transfer printing to the system substrate 12 or pixel module substrate 25. This arrangement has the advantage of using a crystalline semiconductor substrate that provides higher-performance integrated circuit components than can be made in the amorphous or polysilicon semiconductor available on a large substrate such as the system substrate 12.

By employing a multi-step transfer or assembly process, increased yields are achieved and thus reduced costs for the parallel redundant integrated-circuit system 5 of the present invention. Additional details useful in understanding and performing aspects of the present invention are described in U.S. patent application Ser. No. 14/743,981, filed Jun. 18, 2015, entitled Micro Assembled LED Displays and Lighting Elements.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

10 matrix-addressed system
12 system substrate
14 clock
20 pixel
20R pixel
20G pixel
20B pixel
22 full-color pixel module
24 pixel circuit
25 pixel module substrate
26 pixel storage element
28 light element drive circuit
30 column-control circuit
32 column-driver circuit
34 data line
38 column line
40 row-select circuit
41 row-select module
42 serial shift register
44 row storage elements
44A row storage elements
44B row storage elements
46 select control line
48 row-select line
48R red row-select line
48G green row-select line
48B blue row-select line
49 row-control circuit
50 system controller
60 light element/light emitter/light sensor
60R red light element
60G green light element
60B blue light element
62 conductor
100 provide system substrate step
110 dispose array of pixels on system substrate step
112 micro-transfer print light elements on pixel module substrate step
114 dispose pixel substrate on system substrate step
116 electrically connect pixel substrate and light elements step 118 dispose pixel module substrate on system substrate
120 provide column-control circuit step
130 dispose row-select circuit on system substrate step
140 electrically connect pixels on system substrate step

What is claimed:

1. A matrix-addressed system, comprising:
a system substrate;
an array of pixels arranged in rows and columns disposed on the system substrate;
a column-control circuit for providing information to or receiving information from the pixels, the column-control circuit comprising a separate column-driver circuit connected to each column of pixels that provides information in common to all of the pixels in the column or receives information in common from all of the pixels in the column through a corresponding column line; and
a row-select circuit disposed on the system substrate, the row-select circuit comprising a serial shift register comprising a number of row storage elements equal to or larger than the number of rows in the array of pixels, each row storage element in the shift register comprising a corresponding row-select line connected to all of the pixels in a row,
wherein the pixels each comprise one or more light elements and wherein each pixel comprises a pixel circuit connected to the light elements of the pixel, connected to the column-driver circuit corresponding to the column in which the pixel is arranged, and connected to the row-select line corresponding to the row in which the pixel is arranged; and
wherein the pixel circuit comprises a pixel storage element that stores information in response to signals communicated by the row-select line and column-driver circuit to which the pixel circuit is connected.

2. The system of claim 1, wherein:
the light elements are light emitters or light-emitting diodes, or
the light elements are light sensors or photo-sensors sensitive to visible light, infrared light, ultraviolet light, x-rays, or electromagnetic radiation.

3. The system of claim 2, wherein each pixel comprises a pixel circuit that is connected to the light element(s) of the pixel, connected to the column line corresponding to the column in which the pixel is arranged, and connected to the row-select line corresponding to the row in which the pixel is arranged and wherein the pixel circuit is formed in or on one or more pixel substrates that are separate, distinct, and independent of the system substrate.

4. The system of claim 2, wherein the light elements are bare die or unpackaged semiconductor devices.

5. The system of claim 1, wherein the information is digital information.

6. The system of claim 5, wherein the serial shift register is a digital shift register comprising flip-flops or digital latches.

7. The system of claim 1, wherein the light elements are formed in or on one or more light-element substrates that are separate, distinct, and independent of the system substrate.

8. The system of claim 1, wherein the row-select circuit is formed in or on one or more row-select substrates that are separate, distinct, and independent of the system substrate.

9. The system of claim 8, wherein the row-select circuit comprises a plurality of serially connected separate, distinct, and independent row-select substrates that each comprises a row storage element and provides one or more but less than all of the row-select lines.

10. The system of claim 1, comprising a redundant row-select circuit connected in parallel with the row-select circuit.

11. The system of claim 1, wherein the system is a display system comprising an array of light emitters or the system is a sensor system comprising an array of sensors.

12. The system of claim 1, wherein the row-select circuit comprises a control element associated with one or more row storage elements that limits the operation of the one or more row storage elements to those row storage elements whose stored value changes.

13. A method of making a matrix-addressed system, comprising:
providing a system substrate, a column-control circuit, and a display controller;
disposing an array of pixels arranged in rows and columns on the system substrate;
providing a column-control circuit comprising a separate column-driver circuit connected to each column of pixels that provides information in common to all of the pixels in the column or receives information in common from all of the pixels in the column through a corresponding column line;
disposing a row-select circuit on the system substrate, the row-select circuit comprising a serial shift register comprising a number of row storage elements equal to or larger than the number of rows in the array of pixels, each row storage element in the shift register comprising a corresponding row-select output connected to all of the pixels in a row; and
electrically connecting the pixels to the row-select circuit and to the column-control circuit,
wherein disposing the row-select circuit comprises micro-transfer printing the row-select circuit onto the system substrate.

14. The method of claim 13, wherein disposing the array of pixels comprises micro-transfer printing one or more light elements onto the system substrate.

15. The method of claim 13, wherein micro-transfer printing an array of pixels comprises micro-transfer printing one or more light elements onto a pixel module substrate and disposing the pixel module substrate onto the system substrate.

16. The method of claim 13, wherein micro-transfer printing the row-select circuit onto the system substrate comprises micro-transfer printing a plurality of row-select substrates onto the system substrate, the row-select substrates each comprising at least a portion of the row-select circuit.

17. A matrix-addressed system, comprising:
an array of pixels arranged in rows and columns;
a column-control circuit for providing information to or receiving information from the pixels, the column-control circuit comprising a separate column-driver circuit connected to each column of pixels that provides or receives information in common to all of the pixels in the column through a corresponding column line;
a row-select circuit disposed on the system substrate, the row-select circuit comprising a serial shift register comprising a number of row storage elements equal to or larger than the number of rows in the array of pixels, each row storage element in the shift register comprising a corresponding row-select line connected to all of the pixels in a row; and
a system substrate and an array of pixel module substrates, wherein each pixel is disposed on a corresponding pixel module substrate, and wherein the pixel module substrates and the row select circuit are disposed on the system substrate.

18. A matrix-addressed system, comprising:
a system substrate;
an array of pixels arranged in rows and columns disposed on the system substrate;
a column-control circuit for providing information to or receiving information from the pixels, the column-control circuit comprising a separate column-driver circuit connected to each column of pixels that provides information in common to all of the pixels in the column or receives information in common from all of the pixels in the column through a corresponding column line; and
a row-select circuit disposed on the system substrate, the row-select circuit comprising a serial shift register comprising a number of row storage elements equal to or larger than the number of rows in the array of pixels, each row storage element in the shift register comprising a corresponding row-select line connected to all of the pixels in a row;
wherein the row-select circuit is formed in or on one or more row-select substrates that are separate, distinct, and independent of the system substrate; and
wherein the row-select circuit comprises a plurality of serially connected separate, distinct, and independent row-select substrates that each comprises a row storage element and provides one or more but less than all of the row-select lines.

19. A matrix-addressed system, comprising:
a system substrate;
an array of pixels arranged in rows and columns disposed on the system substrate;
a column-control circuit for providing information to or receiving information from the pixels, the column-control circuit comprising a separate column-driver circuit connected to each column of pixels that provides information in common to all of the pixels in the column or receives information in common from all of the pixels in the column through a corresponding column line; and
a row-select circuit disposed on the system substrate, the row-select circuit comprising a serial shift register comprising a number of row storage elements equal to or larger than the number of rows in the array of pixels, each row storage element in the shift register comprising a corresponding row-select line connected to all of the pixels in a row;
wherein the pixels each comprise one or more light elements, and the light elements are light emitters or light-emitting diodes, or the light elements are light sensors or photo-sensors sensitive to visible light, infrared light, ultraviolet light, x-rays, or electromagnetic radiation; and
wherein each pixel comprises a pixel circuit that is connected to the light element(s) of the pixel, connected to the column line corresponding to the column in which the pixel is arranged, and connected to the row-select line corresponding to the row in which the pixel is arranged and wherein the pixel circuit is formed in or on one or more pixel substrates that are separate, distinct, and independent of the system substrate.

20. The system of claim 19, wherein the one or more pixel substrates are disposed on the system substrate.

21. The system of claim 19, wherein the one or more pixel substrates and the light elements are disposed on a pixel module substrate separate and distinct from the system substrate, the one or more pixel substrates, and the light elements, and wherein the pixel module substrate is disposed on the system substrate.

* * * * *